(12) United States Patent
Neelisetty et al.

(10) Patent No.: US 12,112,916 B2
(45) Date of Patent: Oct. 8, 2024

(54) METHODS AND SYSTEMS FOR SAMPLE TRANSFER

(71) Applicant: FEI Company, Hillsboro, OR (US)

(72) Inventors: Krishna Kanth Neelisetty, Brno (CZ); Milos Trenz, Brno (CZ); Jindrich Vondruska, Brno (CZ); Jakub Stetina, Brno (CZ)

(73) Assignee: FEI Company, Hillsboro, OR (US)

( * ) Notice: Subject to any disclaimer, the term of this patent is extended or adjusted under 35 U.S.C. 154(b) by 155 days.

(21) Appl. No.: 17/584,303

(22) Filed: Jan. 25, 2022

(65) Prior Publication Data
US 2023/0132874 A1 May 4, 2023

Related U.S. Application Data

(60) Provisional application No. 63/273,764, filed on Oct. 29, 2021.

(51) Int. Cl.
*H01J 37/18* (2006.01)
(52) U.S. Cl.
CPC .................................. *H01J 37/185* (2013.01)
(58) Field of Classification Search
CPC .... H01J 37/18; H01J 37/185; H01J 2237/204; H01J 2237/2006
See application file for complete search history.

(56) References Cited

U.S. PATENT DOCUMENTS

| 9,885,639 | B2 | 2/2018 | Hasuda et al. |
| 10,551,285 | B2 * | 2/2020 | Gaechter ............... H01J 37/185 |
| 2021/0313139 | A1 | 10/2021 | Maier et al. |

FOREIGN PATENT DOCUMENTS

| DE | 102014110722 A1 | 2/2016 |
| DE | 102015100727 A1 | 7/2016 |
| WO | WO-2020119956 A1 | 6/2020 |

OTHER PUBLICATIONS

EP22204230.1, Extended European Search Report, Apr. 21, 2023, 10 pages.
Tacke et al: "A Versatile High-Vacuum Cryo-transfer System for Cryo-microscopy and Analytics", Biophysical Journal, vol. 110, No. 4, XP055564876, Feb. 1, 2016 (Feb. 1, 2016), pp. 758-765.

* cited by examiner

*Primary Examiner* — David E Smith

(57) ABSTRACT

Air sensitive sample may be transferred between charged particle instruments or between charged particle instrument and a glove box using a sample transfer system. The sample transfer system includes a transfer shuttle for receiving a sample carrier and a transfer rod detachable coupled to the transfer shuttle. The transfer rod moves the sample carrier into or out of the transfer shuttle.

18 Claims, 16 Drawing Sheets

METHODS AND SYSTEMS FOR SAMPLE TRANSFER

CROSS-REFERENCE TO RELATED APPLICATIONS

This application claims the benefit under 35 U.S.C. § 119(e) of U.S. Provisional Application No. 63/273,764, filed 29 Oct. 2021. The entire contents of the aforementioned applications are incorporated by reference herein.

BACKGROUND OF THE INVENTION

Charged particle microscopy is a well-known and increasingly important technique for imaging and analyzing microscopic objects. During a workflow involving charged particle microscope, a sample may need to be transferred among multiple tools for imaging, processing, manipulation, and/or storage. Some sample, such as a battery sample, may be air sensitive and thus has to be transferred in vacuum or inert gas environment. Applicant recognizes that current sample transfer system is bulky, difficult to operate, and may require tool modification.

SUMMARY

In one embodiment, a sample transfer system for transferring a sample carrier into or out of a vacuum chamber comprises: a transfer shuttle including a shuttle chamber for receiving the sample carrier, and a transfer rod detachably coupled to the transfer shuttle, wherein the sample carrier is transferrable into or out of the shuttle chamber by operating the transfer rod.

In another embodiment, a method for transferring a sample into a vacuum chamber comprises: attaching a first side of a transfer shuttle to a sample loader fixed to a wall of the vacuum chamber, wherein a transfer rod is detachably coupled to a second side of the transfer shuttle; providing vacuum to the sample loader; fluidically connecting a shuttle chamber of the transfer shuttle with the vacuum chamber; and transferring a sample carrier from the shuttle chamber to the vacuum chamber by operating the transfer rod.

In yet another embodiment, a method for transferring a sample out of a vacuum chamber, comprises: mechanically coupling a sample carrier holding the sample to a shuttle carrier of a transfer shuttle, wherein the shuttle carrier is locked to a transfer rod detachably connected with the transfer shuttle; transferring the sample carrier from the vacuum chamber into a shuttle chamber of the transfer shuttle by operating the transfer rod; hermetically sealing the shuttle chamber from the sample loader; and detaching the transfer shuttle from the vacuum chamber.

In this way, air sensitive sample may be transferred into and out of the vacuum chamber using the sample transfer system without contacting air. The sample may be transferred into and out of a glove box by only transferring the transfer shuttle into or out of the glove box, without the transfer rod attached to the transfer shuttle. Within the glove box, the sample may be transferred into or out of the transfer shuttle using a second transfer rod. Due to the small profile of the transfer shuttle, large antechamber of the glove box is not required for air sensitive sample transfer.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION

Figure 1:
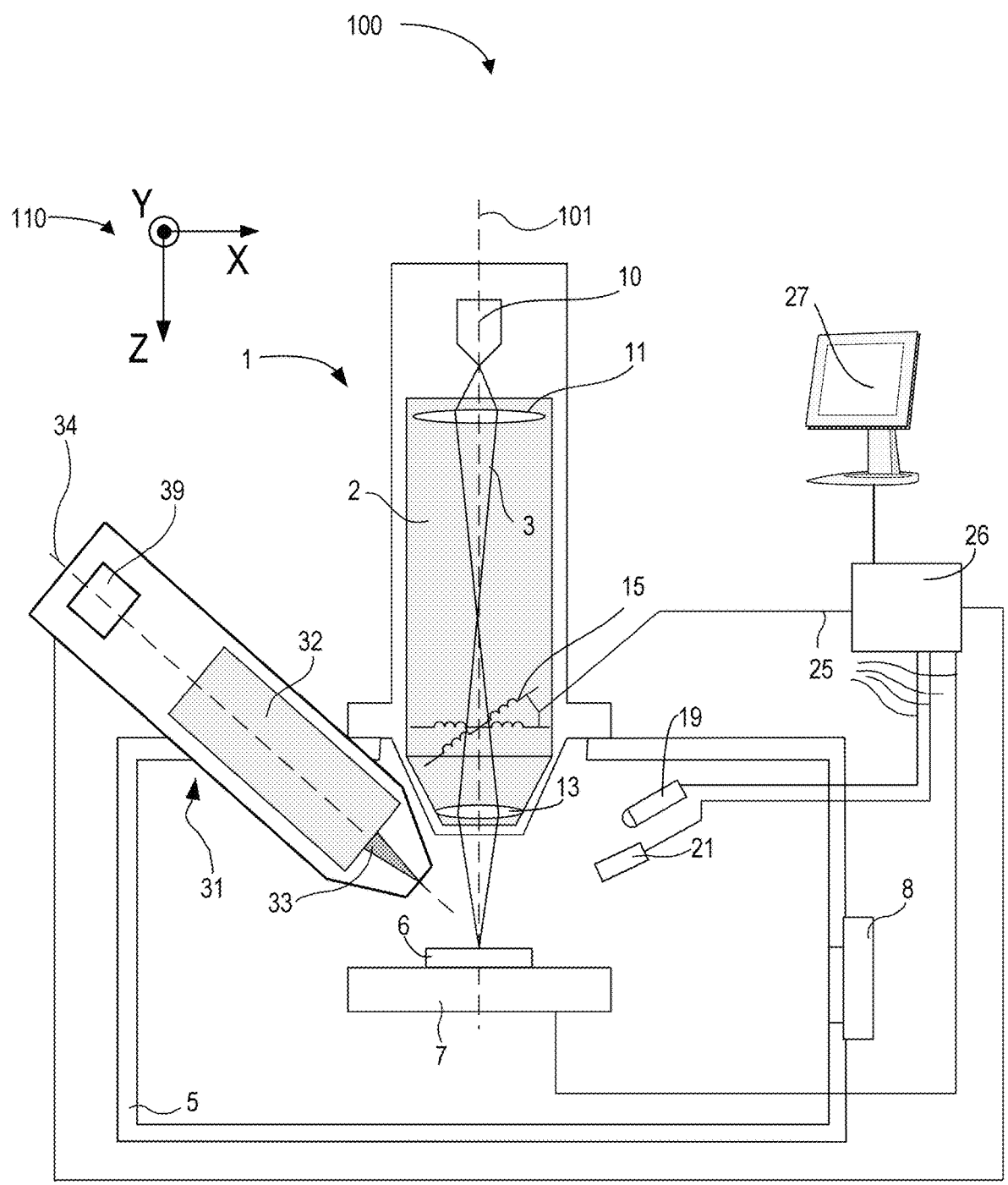
FIG. 1 illustrates an example of a charged particle microscope.

The following description relates to systems and methods for transferring one or more samples into or out of a vacuum chamber. The sample transfer system may be used to transfer one or more samples between tools, for example, between different charged particle instruments or between a charged particle instrument and a glove box. The charged particle instrument may be a charged particle microscope or a charged particle processing device. The charged particle instrument may image and/or process the sample. The sample is hermetically sealed from external environment during the entire sample transfer process. As such, air sensitive sample, such as battery sample, is not oxidized during sample transfer. The sample may be moved into or out of the transferring system by operating a transfer rod, for example, by sliding a transfer post along the transfer rod. The transfer rod needs to be sufficiently long in order to transfer the sample onto a sample stage within the vacuum chamber. In a conventional sample transfer system, the transfer rod is permanently attached to the rest of the transferring system. Applicant recognizes that the long transfer rod makes the entire transfer system bulky and difficult to maneuver. Further, the transfer rod increases the overall profile of the transferring system, and thus requires a large antechamber for moving the transferring system into the glove box.

In order to address the above issues, a sample transfer system including a transfer shuttle and a detachable transfer rod is presented herein. The transfer rod is attached to the transfer shuttle for moving the sample into or out of the transfer shuttle. The transfer rod may be detached/removed from the transfer shuttle when the sample is safely docked or locked inside the shuttle chamber and the shuttle chamber is hermetically sealed. The sample within the shuttle chamber may remain in a vacuum or in an inert gas environment. The sample may also be temporarily stored in the shuttle chamber of the transfer shuttle, without the transfer rod attached to the transfer shuttle. The transfer shuttle, holding the air sensitive sample, may be moved into the glove box without the transfer rod attached to it. As such, a smaller antechamber is required comparing to the conventional transfer system for sample transfer. Within the glove box, the sample may be moved into or out of the transfer shuttle using a second transfer rod. The second transfer rod may be shorter than the transfer rod used for transferring sample to the charged particle microscope.

In one example, the transfer shuttle includes a shuttle chamber enclosed by the wall of the transfer shuttle. The shuttle chamber includes an opening hermetically sealable from external environment by a shuttle valve. A first side of the shuttle chamber may be fluidically connected with a sample loader fixed to a wall of the vacuum chamber via the opening. A second, opposite, side of the shuttle chamber may be detachable coupled to the transfer rod. A shuttle carrier may be detachably coupled with a sample carrier for holding one or more samples. In some examples, gas pressure within the shuttle chamber may be monitored with a pressure sensor coupled to the wall of the transfer shuttle.

In one example, the transfer rod includes a transfer post sliding movable relative to a cylindrical shell. The transfer post may be coaxially positioned within the shell extended along the longitudinal axis of the transfer rod. The transfer post includes a distal end and a proximal end. The distal end of the transfer post may be locked to the shuttle carrier of the transfer shuttle by operating a switch at the proximal end of the transfer post. By sliding the transfer post along the longitudinal axis of the transfer rod, relative to the shell, the shuttle carrier together with the sample carrier locked to the shuttle carrier may be moved into or out of the shuttle chamber. By rotating the transfer post relative to the shell, the transfer carrier may be locked to the wall of the transfer shuttle. When the transfer shuttle is coupled with both the transfer rod and the sample loader, the distal end of the transfer post is fluidically connected with the sample loader, bypassing the shuttle chamber, via a channel. At least part of the channel may be embedded inside the wall of the transfer shuttle. By fluidically connecting the distal end of the transfer post with the sample loader, any residual air around the distal end of the transfer post may be drawn through the channel to the sample loader.

In one embodiment, a method for transferring a sample into a vacuum chamber comprises: attaching a first side of a transfer shuttle to a sample loader fixed to a wall of the vacuum chamber, wherein a transfer rod is detachably coupled to a second side of the transfer shuttle; providing vacuum to the sample loader; fluidically connecting a shuttle chamber of the transfer shuttle with the vacuum chamber; and transferring a sample carrier from the shuttle chamber to the vacuum chamber by operating the transfer rod. When vacuum is provided to the sample loader, a distal end of the transfer rod is fluidically connected with the sample loader while the shuttle chamber of the transfer shuttle is hermitically sealed from the sample loader. The fluid connection between the sample loader and the distal end of the transfer rod is achieved by a channel formed between the distal end of the transfer post of the transfer rod and the sample chamber. If the sample is stored in the shuttle chamber in vacuum, after vacuum is formed around the distal end of the transfer post, fluidic connection between the shuttle chamber and the vacuum chamber may be formed by opening a shuttle value between the shuttle chamber and the sample loader and a loader valve between the sample loader and the vacuum chamber. The shuttle carrier may be moved from the transfer chamber to the vacuum chamber, for example, by sliding the transfer post along the shell, towards the vacuum chamber. If the sample is stored in the shuttle chamber in an inert gas environment, after vacuum is formed around the distal end of the transfer post, the sample loader is filled with inert gas so that the shuttle valve can be opened. Then, after the shuttle valve is opened, the sample chamber is pumped down again before opening the loader valve to obtain fluidic connection between the shuttle chamber and the vacuum chamber. The sample carrier may then be transferred from the shuttle chamber to the vacuum chamber.

In another embodiment, a method for transferring a sample out of a vacuum chamber comprises: mechanically coupling a sample carrier to a shuttle carrier of a transfer shuttle, wherein the shuttle carrier is locked to a transfer rod detachably connected with the transfer shuttle; transferring the sample carrier into a shuttle chamber of the transfer shuttle by operating the transfer rod; hermetically sealing the sample transfer shuttle from the vacuum chamber; and detaching the transfer shuttle from the vacuum chamber. The transfer rod may then be removed from the transfer shuttle. The sample may be stored inside the transfer shuttle, or be transferred to another tool, such as another charged particle microscope or a glove box. In some examples, the shuttle chamber may be filled with inert gas before being hermetically sealed from the sample loader.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the detailed description is not to be taken in a limiting sense.

Turning to FIG. 1, FIG. 1 is a highly schematic depiction of an embodiment of a dual-beam charged particle microscope (CPM). Coordinate 110 is system coordinate. Microscope 100 comprises a particle-optical column 1, which produces a beam 3 of charged particles (in this case, an electron beam) that propagates along electron-optical axis 101. Electron-optical axis 101 may be aligned with the Z axis of the system. The column 1 is mounted on a vacuum chamber 5, which comprises a sample stage 7 and associated actuators (not shown) for positioning a sample carrier 6 held by the sample stage. The sample carrier 6 may hold one or more samples. The vacuum chamber 5 is evacuated using vacuum pumps (not depicted). Sample carrier may be introduced to or removed from the vacuum chamber via sample loader 8 on the wall of the vacuum chamber.

The electron column 1 comprises an electron source 10 and an illuminator 2. The illuminator 2 comprises lenses 11 and 13 to focus the electron beam 3 onto the sample, and a deflection unit 15 (to perform beam steering/scanning of the beam 3). The microscope 100 further comprises a controller/computer processing apparatus 26 for controlling inter alia the deflection unit 15, lenses 11, 13 and detectors 19, 21, and 41, and displaying information gathered from the detectors 19, 21, and 41 on a display unit 27.

The detectors 19 and 21 may be chosen from a variety of possible detector types that can be used to examine different types of "stimulated" radiation emanating from the sample in response to irradiation by the (impinging) electron beam 3. It could alternatively be an X-ray detector, such as Silicon Drift Detector (SDD) or Silicon Lithium (Si(Li)) detector, for example. Detector 21 may be an electron detector in the form of a Solid State Photomultiplier (SSPM) or evacuated Photomultiplier Tube (PMT) for example. This can be used to detect backscattered and/or secondary electrons emanating from the sample. Microscope 100 may also include an ion detector and a mass analyzer for SIMS imaging. The skilled artisan will understand that many different types of detector can be chosen in a set-up such as that depicted, including, for example, an annular/segmented detector.

By scanning the beam 3 over the sample held by sample carrier 6, stimulated radiation—comprising, for example, X-rays, infrared/visible/ultraviolet light, secondary electrons (SEs) and/or backscattered electrons (BSEs) —emanates from the sample. Since such stimulated radiation is position-sensitive (due to said scanning motion), the information obtained from the detectors 19 and 21 will also be position-dependent.

The signals from the detectors pass along control lines (buses) 25, are processed by the controller 26, and displayed on display unit 27. Such processing may include operations such as combining, integrating, subtracting, false coloring, edge enhancing, and other processing known to the skilled artisan. In addition, automated recognition processes (e.g. as used for particle analysis) may be included in such processing. The controller includes a non-transitory memory for storing computer readable instructions, and a processor for executing the computer readable instructions. Methods disclosed herein may be implemented by executing the computer readable instructions in the processor.

In addition to the electron column 1 described above, the microscope 100 also comprises an ion column 31. This comprises an ion source 39 and an illuminator 32, and these produce/direct a focused ion beam (FIB) 33 along an ion-optical axis 34. To facilitate easy access to sample, the ion-optical axis 34 is canted relative to the electron-optical axis 101. As hereabove described, such ion column 31 can, for example, be used to perform processing/machining operations on the sample, such as incising, milling, etching, depositing, etc. Additionally, the ion column 31 can be used to produce imagery of the sample. It should be noted that ion column 31 may be capable of generating various different species of ion; accordingly, references to ion beam 33 should not necessarily been seen as specifying a particular species in that beam at any given time—in other words, the ion beam 33 might comprise ion species A for operation A (such as milling) and ion species B for operation B (such as implanting), where species A and B can be selected from a variety of possible options.

The microscope may include a Gas Injection System (GIS), which can be used to effect localized injection of gases, such as etching or precursor gases, etc., for the purposes of performing gas-assisted etching or deposition. Such gases can be stored/buffered in a reservoir and can be administered through a narrow nozzle, so as to emerge in the vicinity of the intersection of axes 101 and 34, for example.

In another example, the CPM is a scanning electron microscope (SEM) that includes only the electron column.

Figure 2A:
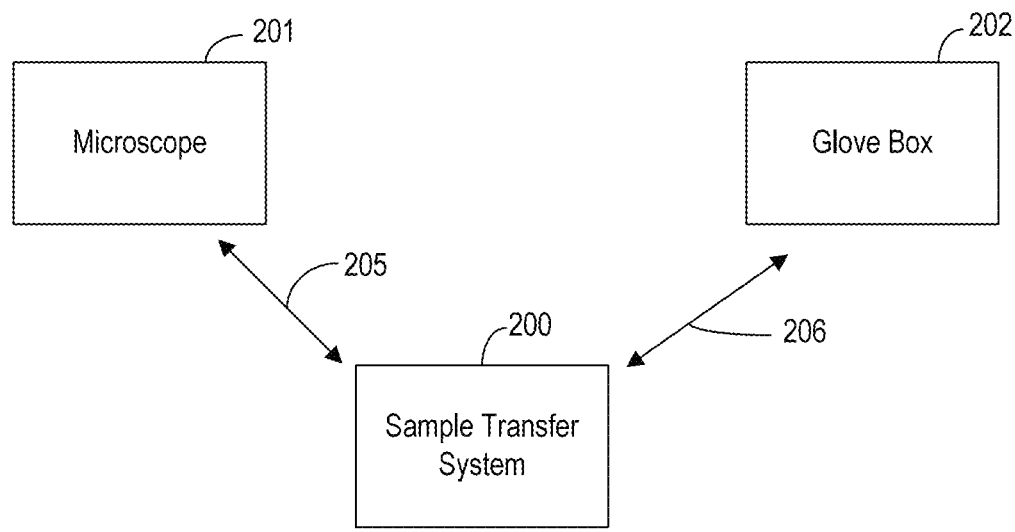
FIG. 2A and FIG. 2B illustrate using a sample transfer system for transferring air sensitive samples between tools.
Figure 2B:
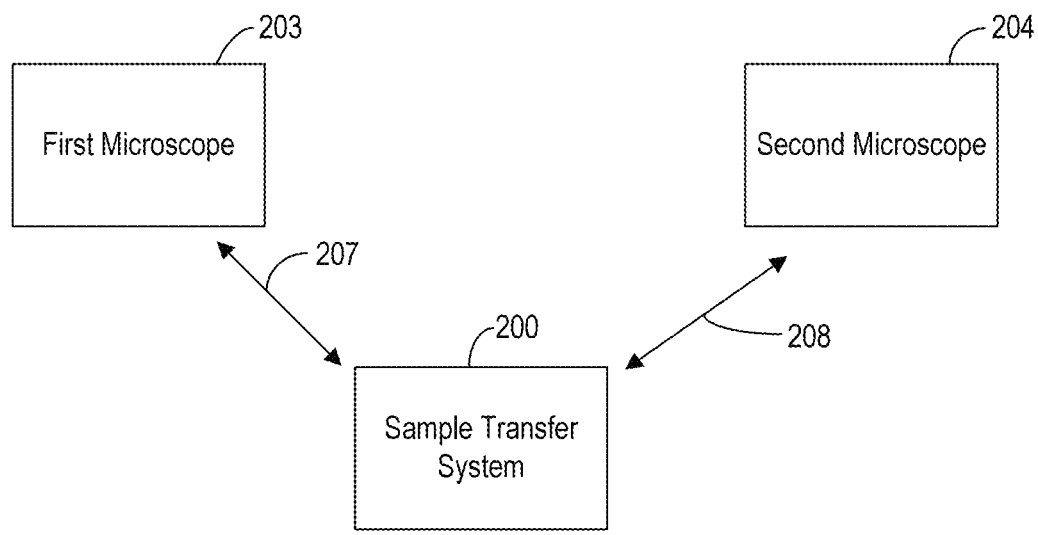

FIGS. 2A and 2B illustrates example sample transfer processes between different tools. Arrows 205-208 indicate sample transfer direction. The sample transfer system may be used to move samples between CPM 201 and glove box 202, or between two different CPMs (203 and 204). The CPM may be a dual-beam CPM as shown in FIG. 1 or a SEM. In some examples, the sample transfer system may be used to transfer sample into and out of other charged particle instrument, such ion beam polisher and X-ray photoelectron spectroscopy. In other examples, the sample transfer system may be used to transfer sample into and out of other microscopy system, such as a Raman microscope.

Figure 3:
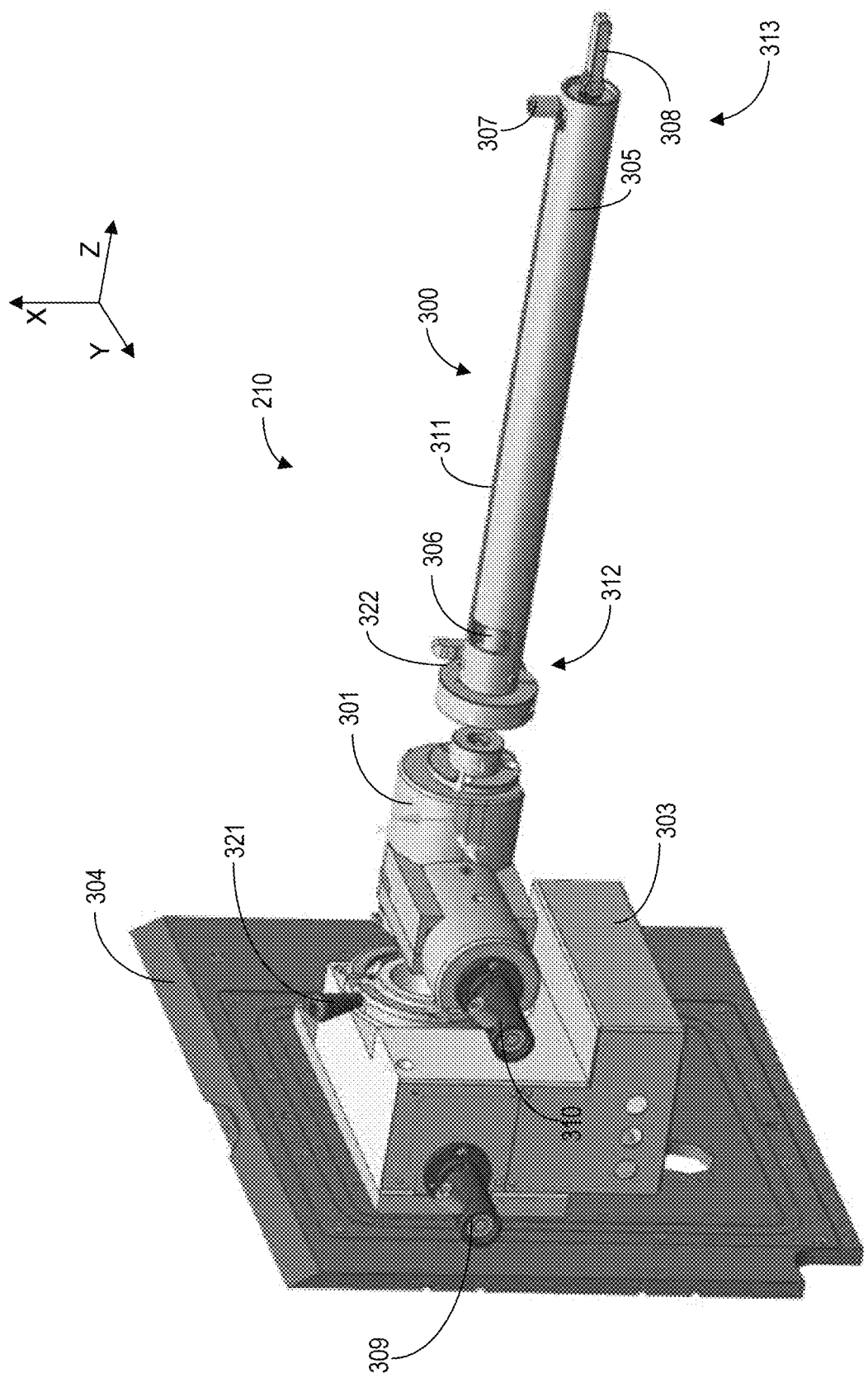
FIG. 3 shows an example of the sample transfer system, with transfer shuttle uncoupled from the sample loader and the transfer rod.

FIG. 3 shows one example of the sample transfer system 210, sample loader 303, and the external wall 304 of a vacuum chamber. In this figure, the transfer shuttle 301 is separated or detached from the sample loader 303 and the transfer rod 300. The sample loader, transfer shuttle and the transfer rod may be assembled/coupled along the Z-axis. A first side of the transfer shuttle may be coupled to the sample loader, and a second, opposite (i.e. along Z-axis) side, of the transfer shuttle may be coupled to the transfer rod. The vacuum chamber may belong to a charged particle microscope such as a dual-beam CPM or a SEM. The sample loader 303 is fixed to the external wall 304 of the vacuum chamber. The sample loader can be mechanically coupled with the transfer shuttle using loader clamp 321. The sample loader 303 is hermetically sealable from the vacuum chamber by manually operating a loader valve, for example, by operating valve handle 309 of the loader valve. In some examples, the loader valve may be controlled by a controller. The sample transfer system 210 includes transfer shuttle 301 and detachable transfer rod 300. The first side of the transfer shuttle can mechanically couple with sample loader 303. The transfer shuttle is hermetically sealable from the sample loader 303 by a shuttle valve. The shuttle valve can be manually operated by valve handle 310. The shuttle valve may alternatively be operated by a controller. The second side of the transfer shuttle 301 may be mechanically coupled with transfer rod 300. Transfer rod 300 includes a transfer post 306 coaxially positioned within a cylindrical shell 305. The shell 305 maybe locked with the transfer shuttle using rod clamp 322. The transfer rod may slide along the longitudinal axis (herein Z-axis) of the transfer rod by operating knob 307. Knob 307 is fixed to the transfer post 306 and can be moved along slit 311 on shell 305. The proximal end 313 of the transfer post includes switch 308 for locking/unlocking the transfer post to a shuttle carrier of the transfer shuttle 301. Different transfer rods, such as transfer rods of various length, may be used to move sample into/out of the transfer shuttle.

Figure 4:
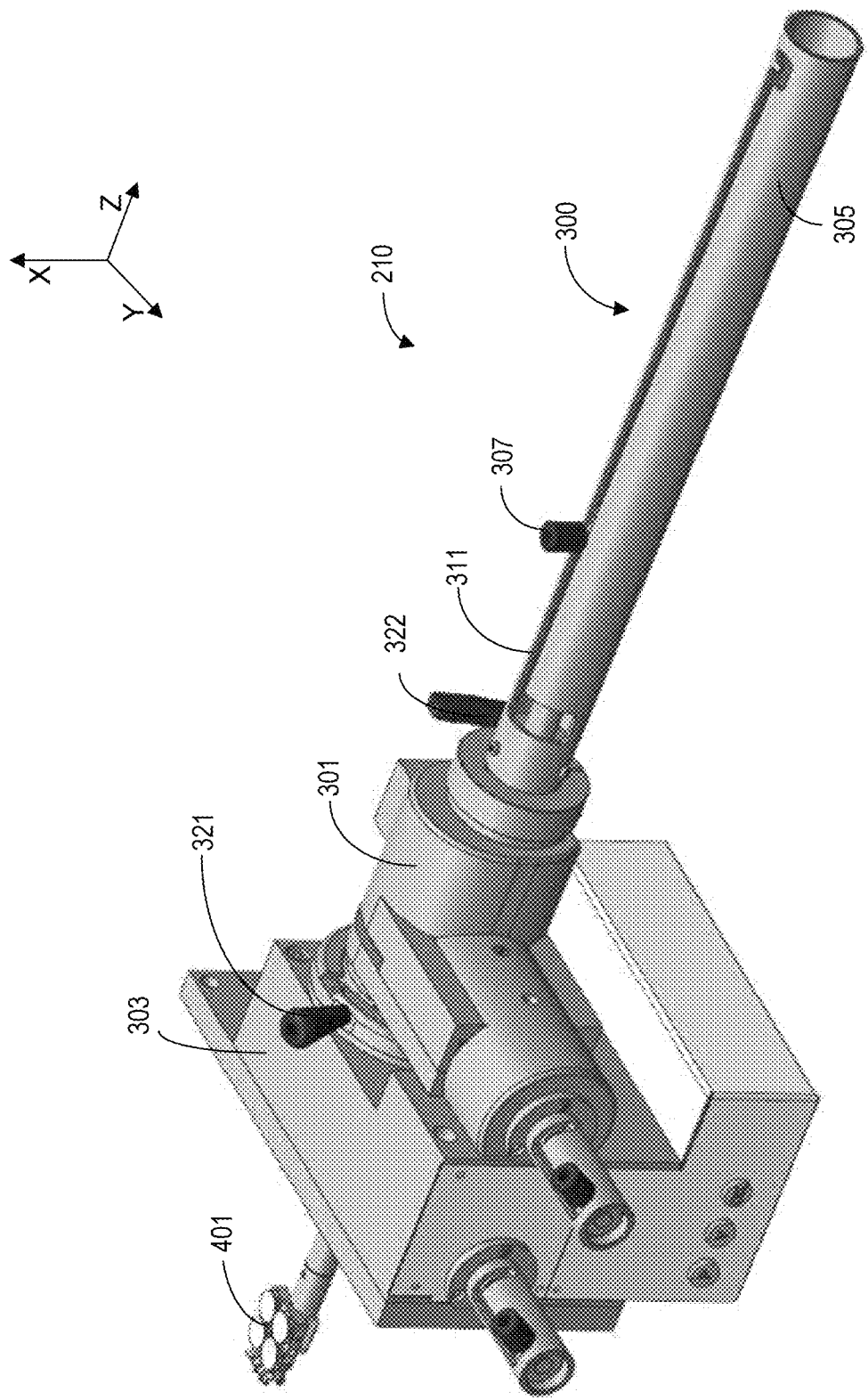
FIG. 4 shows the sample transfer system, with transfer shuttle coupled with the sample loader and the transfer rod.

FIG. 4 shows the sample transfer system 210 coupled to the sample loader 303 during sample transfer. The transfer shuttle 301 is locked to the sample loader 303 using loader clamp 321, and the transfer rod 300 is locked to the transfer shuttle 301 using rod clamp 322. The loader valve and the shuttle valve are opened to allow sample carrier being moved into/out of the shuttle chamber of the transfer shuttle. The transfer post is locked with the shuttle carrier, and the shuttle carrier is locked with sample carrier 401. Comparing to FIG. 3, knob 307 is slid along slit 311 of shell 305 so that the sample carrier 401 is outside of the transfer shuttle and the sample loader.

Figure 5A:
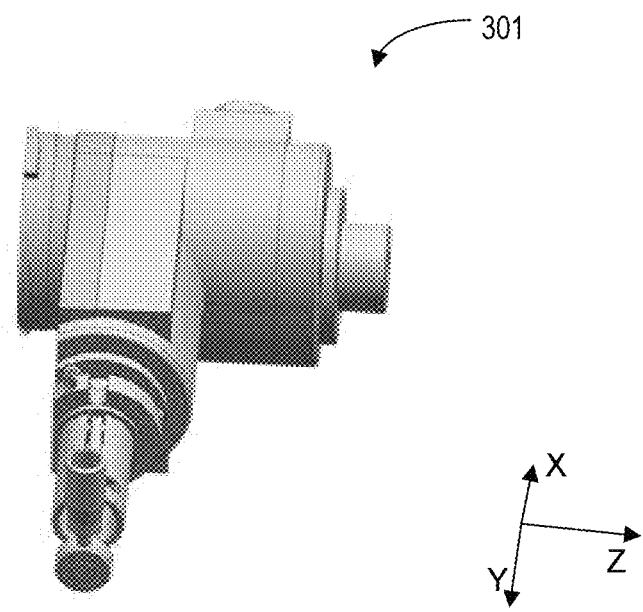
FIG. 5A shows the transfer shuttle.
Figure 5B:
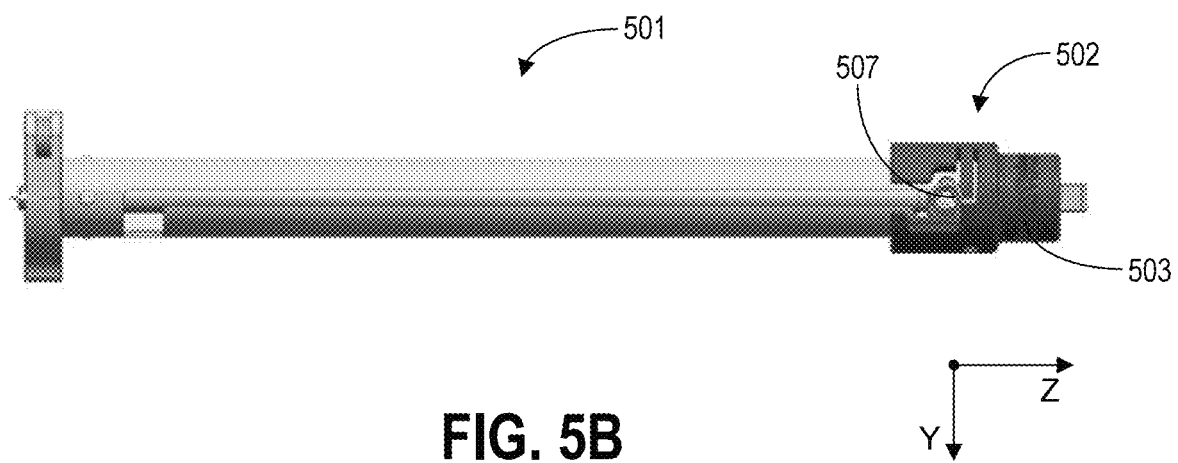
FIG. 5B shows the transfer rod.

FIG. 5A shows transfer shuttle 301. Samples within the transfer shuttle 301 may be maintained in a vacuum or an inert gas environment. FIG. 5B shows another example transfer rod 501. Different from transfer rod shown in FIGS. 3-4, herein, the transfer rod includes a cap 503 at the proximal end 502 of the transfer rod 501, for guiding the knob 307 to different transfer rod positions. In one example, as shown in FIG. 12D, the transfer rod may have four positions: Lock, Unlock, Park, and Transfer. At the Lock position, the shuttle carrier is locked to the rest of the transfer shuttle. The transfer rod may be detached from the transfer shuttle. By moving the knob from the Lock to the Unlock position, the shuttle carrier is unlocked from the shuttle chamber, and may move along the longitudinal axis of the transfer rod. At the Park position, the shuttle carrier may be rotated around and slid along the longitudinal axis of the transfer rod using the transfer post. At the Transfer position, the transfer post may push the shuttle carrier along the slit on the shell to move the shuttle carrier outside of the transfer shuttle.

Figure 6A:
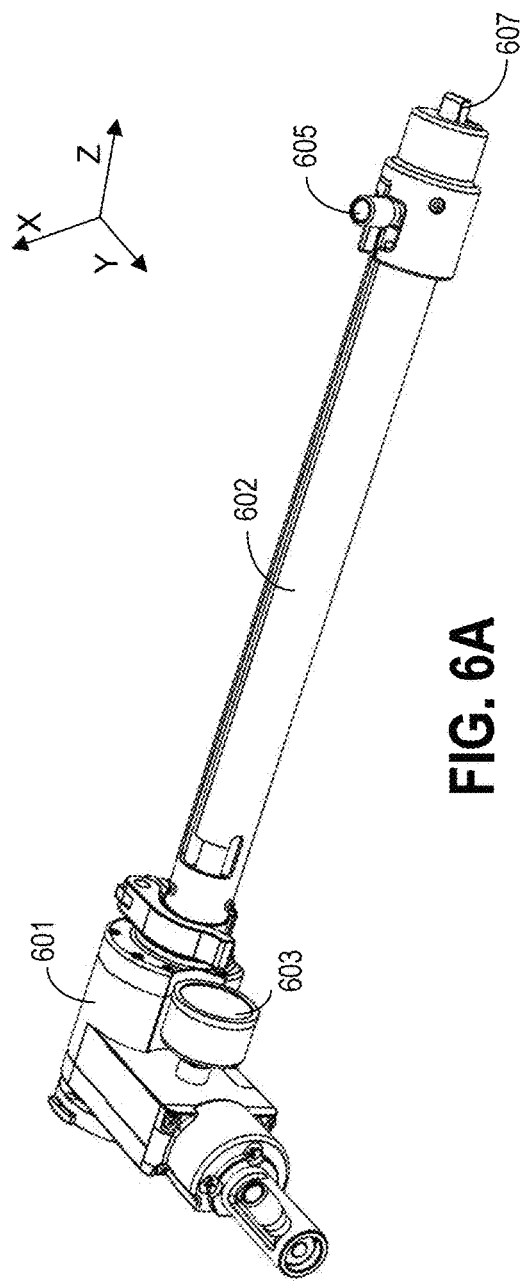
FIG. 6A and FIG. 6B show another example of the sample transfer system, from different viewing angles.
Figure 6B:
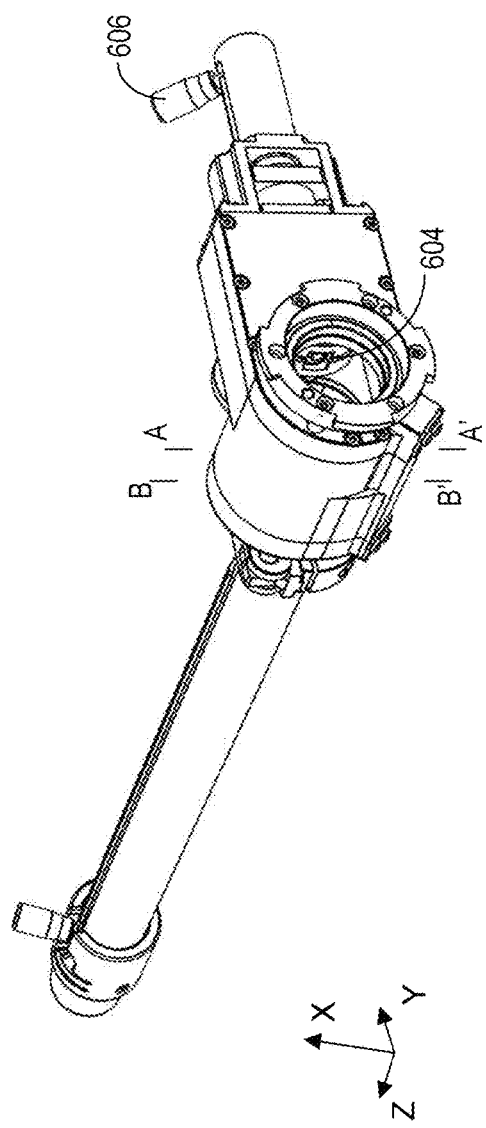

FIG. 6A and FIG. 6B are two different views of another example of transfer shuttle coupled with a transfer rod. Different form the transfer shuttle shown in FIGS. 3-4 and 5A, transfer shuttle 601 includes a pressure sensor 603 for monitoring the pressure in the shuttle chamber. The knob 605 of the transfer rod is at the Lock position. Shuttle valve 604 is opened to allow the shuttle carrier extending outside of the shuttle chamber. The shuttle valve 604 is opened using valve handle 606. Herein, shuttle valve 604 has a double door mechanism.

Figure 7:
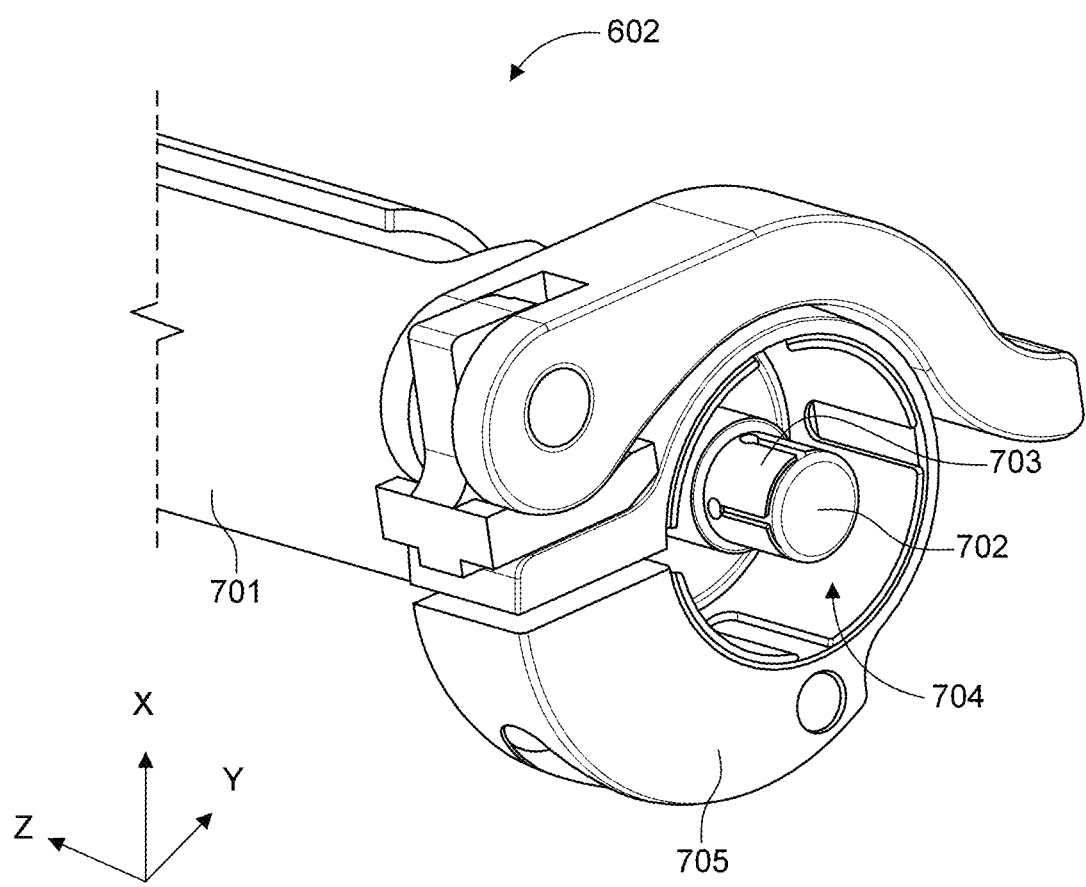
FIG. 7 shows a distal end of the transfer rod.

FIG. 7 shows the distal end of the transfer rod 602, when the distal end 704 of the transfer post is not coupled with the transfer carrier. Transfer rod 602 includes shell 701 and clamp 705. The distal end 704 of the transfer post includes a trapezoidal member 702 and cap 703. The transfer rod may be rotatable aligned with the transfer shuttle by a guiding pin on the transfer shuttle.

Figure 8A:
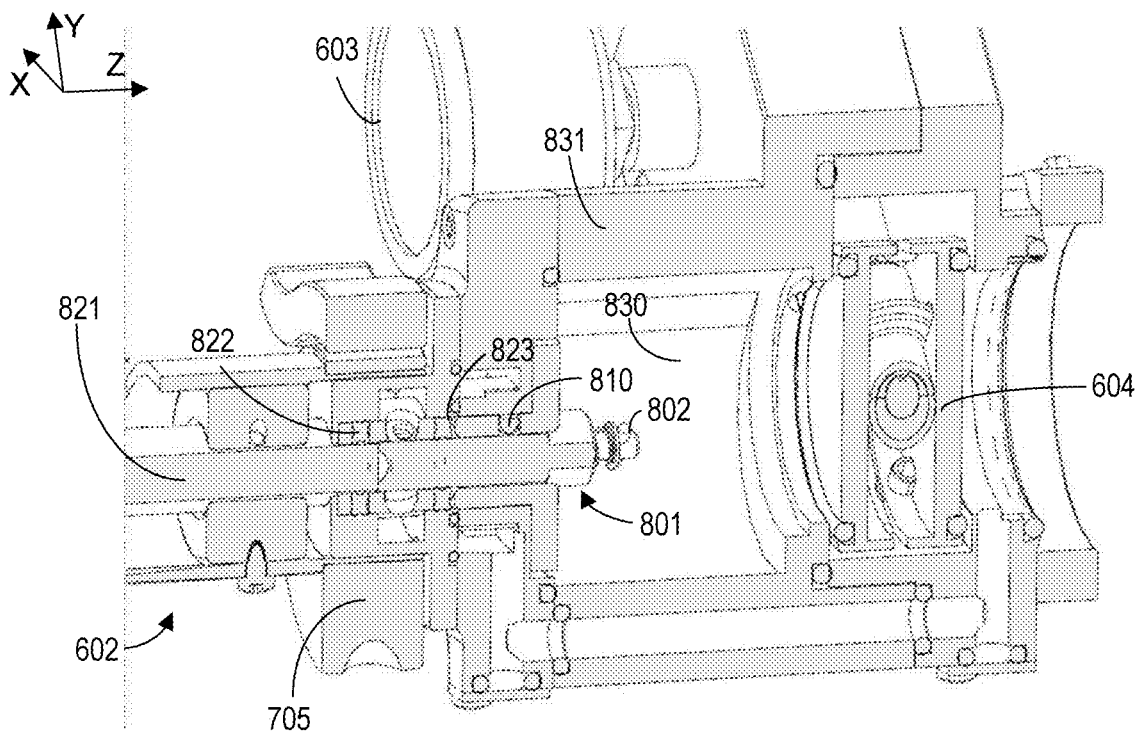
FIG. 8A is a cross-section of the transfer shuttle coupled to the transfer rod.

FIG. 8A is a zoomed-in view of a cross-section of the sample transfer system shown in FIGS. 6A and 6B, wherein the transfer shuttle 601 is locked with transfer rod 602 with rod clamp 705. The cross-section is parallel to the longitudinal axis (Z-axis) of the transfer rod 602. The transfer rod is at the Lock position. Transfer shuttle 601 includes a shuttle chamber 830 for receiving or storing the sample carrier. The shuttle chamber 830 is surrounded by wall 831. Shuttle carrier 801 may be locked onto sample carrier (not shown here) with the first pin 802 of the shuttle carrier. The shuttle carrier 801 includes a second pin 810 for docking/locking the sample carrier to wall 831 of the shuttle chamber. The shuttle carrier may be released from wall 831 by rotating and sliding the shuttle carrier relative to the Z-axis using the transfer post 821. By rotating and sliding the shuttle carrier, the second pin 810 may be released from a groove in wall 831.

Figure 8B:
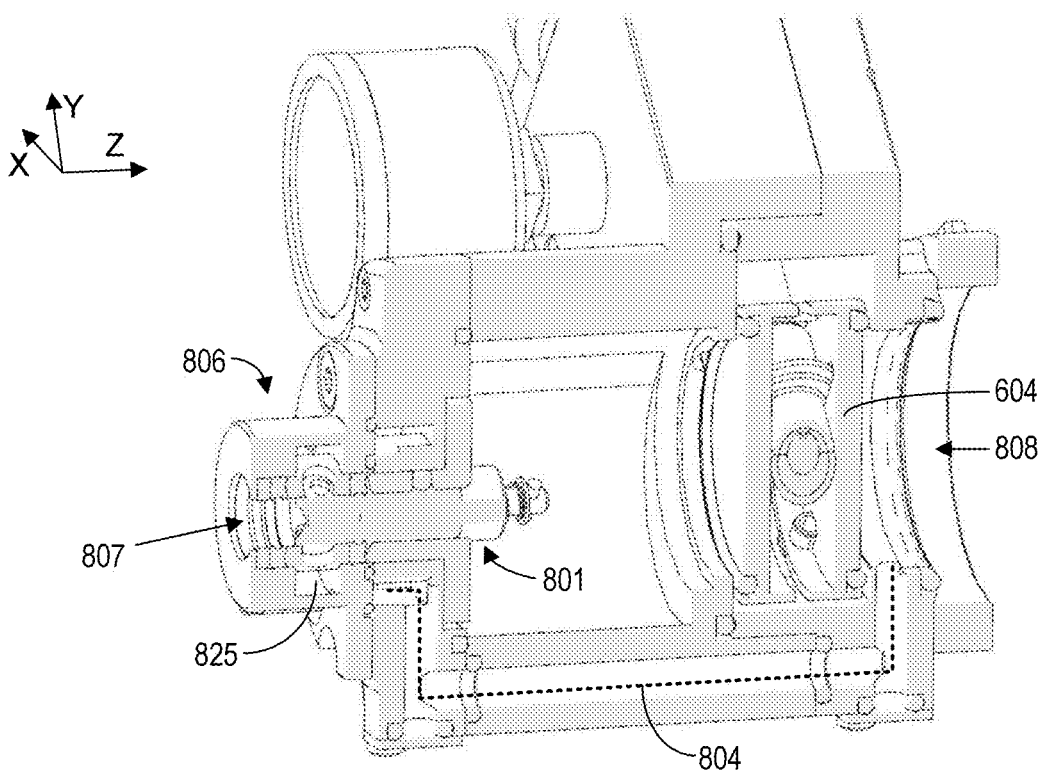
FIG. 8B is the same cross-section of FIG. 8A, showing only the transfer shuttle.

FIG. 8B shows only the transfer shuttle, at the same cross-section as FIG. 8A, without showing the transfer rod. In this figure, the transfer rod is still attached to the transfer shuttle. The transfer rod is not shown so that features of the transfer shuttle can be visualized. The first side of the transfer chamber includes a first opening 808 hermetically sealable by shuttle valve 604. The second, opposite side, of the transfer chamber has a second opening 807 hermetically sealed by transfer carrier 801, O-ring 822, and O-ring 823. The first opening 808 can be coupled to a sample loader. The cross-sections in FIGS. 8A and 8B are created in a way to visualize part of channel 804. At least a part of channel 804 is within wall 831. Channel 804 also extends to region 825 (i.e. a region between O-ring 822 and O-ring 823). Through channel 804, the sample loader is fluidically connected with the distal end of the transfer post, bypassing the shuttle chamber. As such, gas at the distal end of the transfer post 821 may be drawn to the sample loader via the channel.

Figure 8C:
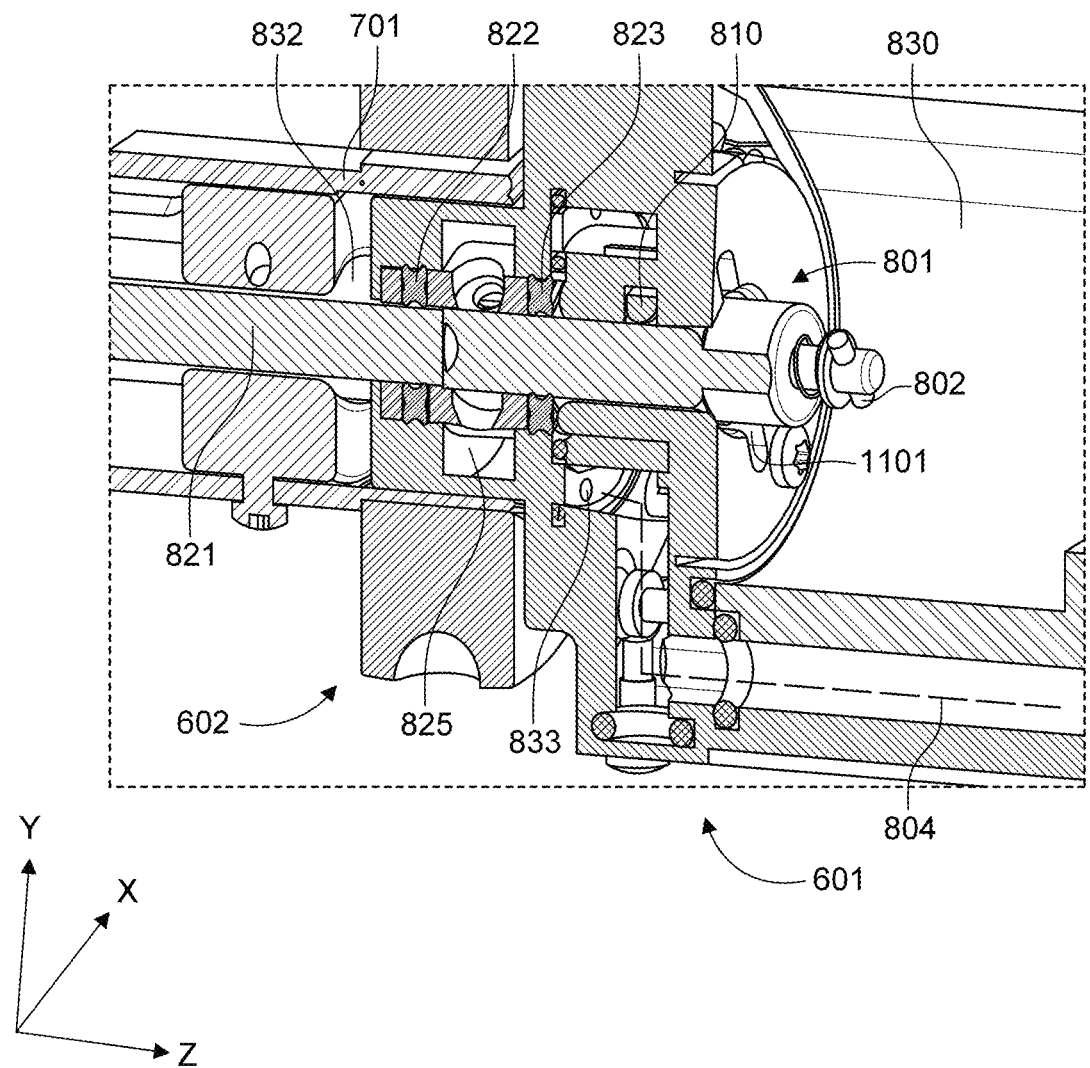
FIG. 8C is another cross-section of the transfer shuttle coupled to the transfer rod.

FIG. 8C is a zoomed-in cross-section showing the connection between the transfer rod 602 and the transfer shuttle 601. The cross-section is parallel to the Z-axis. The transfer rod is at the Locked position. Second pin 810 is within groove 1101. Region 825 is fluidically connected to channel 804 via hole 833. As such, the distal end of the transfer post 821 is in fluidic connection with the sample loader via channel 804. Region 825 is hermetically sealed from region 832 (a region formed by transfer post 821, shell 701, and transfer shuttle 601) by O-ring 822. The shuttle chamber 830 is hermetically sealed from region 825 by O-ring 823. Locations of O-rings 822 and 823 are illustrated with dashed crosses.

Figure 9:
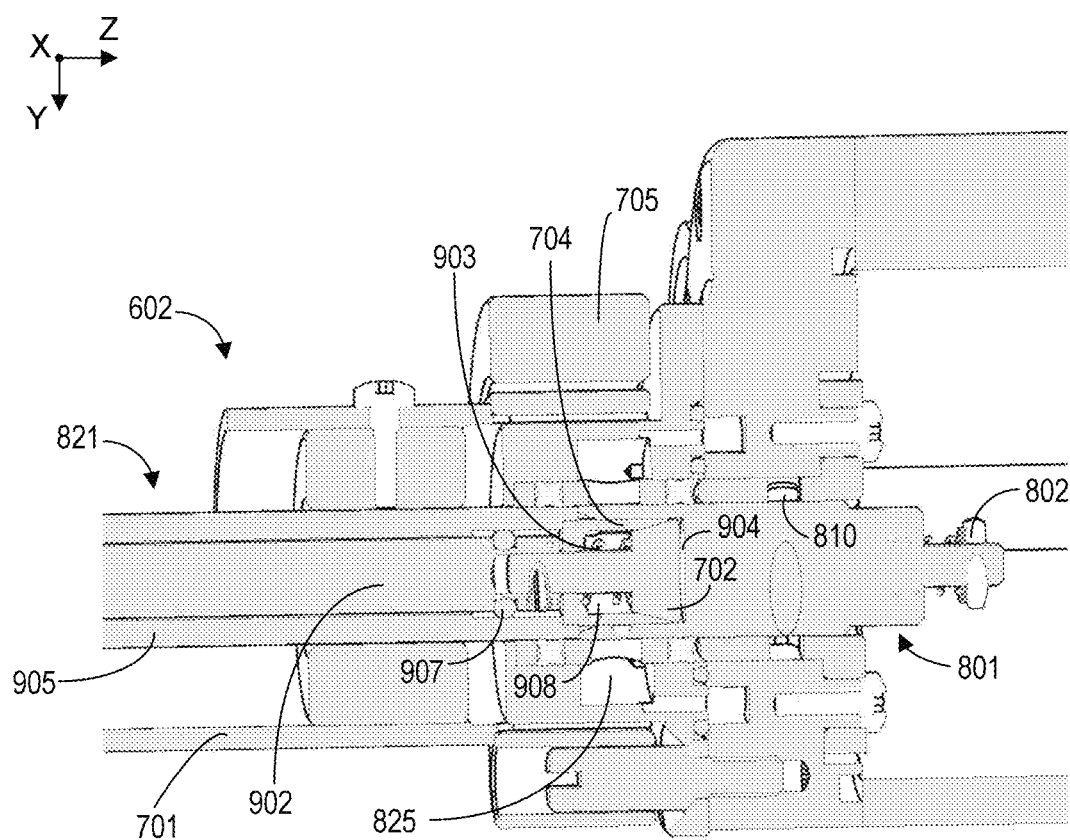
FIG. 9 is another cross-section of the transfer shuttle coupled to the transfer rod.

FIG. 9 is another zoomed-in view of a cross-section of the sample transfer system shown in FIGS. 6A and 6B. The cross-section is parallel to the longitudinal axis (Z-axis) of the transfer rod 602. The transfer post 821 includes a transfer post core 902 sliding movable relative to the transfer post shell 905. Operating the transfer rod to lock the transfer post with the shuttle carrier includes operating a switch (such as switch 607 in FIG. 6A) of the transfer post, to slide the transfer post core relative to the transfer post shell. By doing so, at the distal end of the transfer post, the trapezoidal member 702 pushes cap 703 against the receptacle 904 of shuttle carrier 801 and compresses spring 903. The distal end of the transfer post is therefore locked with the shuttle carrier. When the transfer post is locked with the shuttle carrier, there is no relative rotation or translation between the transfer post and the shuttle carrier. When the transfer rod is in the Unlock position as shown in this figure or in the locked position, region 825 is in fluidic connection with the region 908 (around trapezoidal member 702). As such, gas in region 908 may be removed via channel 804. O-ring 907 seals the distal end of the transfer post 821 from the rest of the transfer post.

Figure 10:
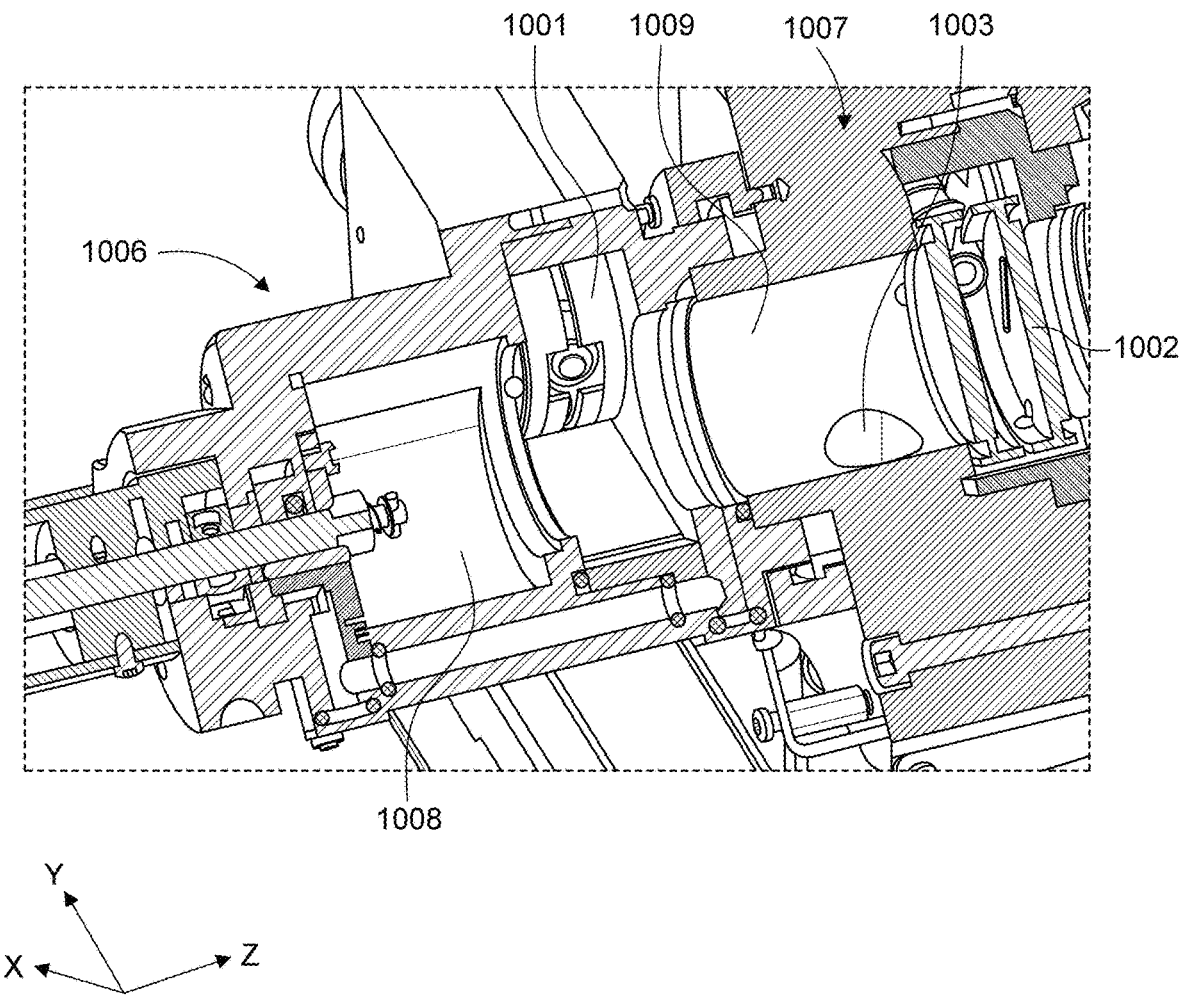
FIG. 10 is a cross-section of the transfer shuttle coupled to both the transfer rod and the sample loader.

FIG. 10 shows a cross-section of an example sample transfer system 1006 coupled to the sample loader 1007. The cross-section is parallel to the longitudinal axis (Z-axis) of the transfer rod. The sample transfer system 1006 includes a transfer rod locked to a transfer shuttle. The shuttle valve 1001 between the shuttle chamber 1008 and the chamber 1009 of the sample loader 1007 is opened. The sample loader is hermetically sealable from the vacuum chamber by loader valve 1002. The sample loader 1007 includes an opening 1003 for drawing gas outside of the sample loader. Gas may also enter the sample loader via the opening.

Figure 11A:
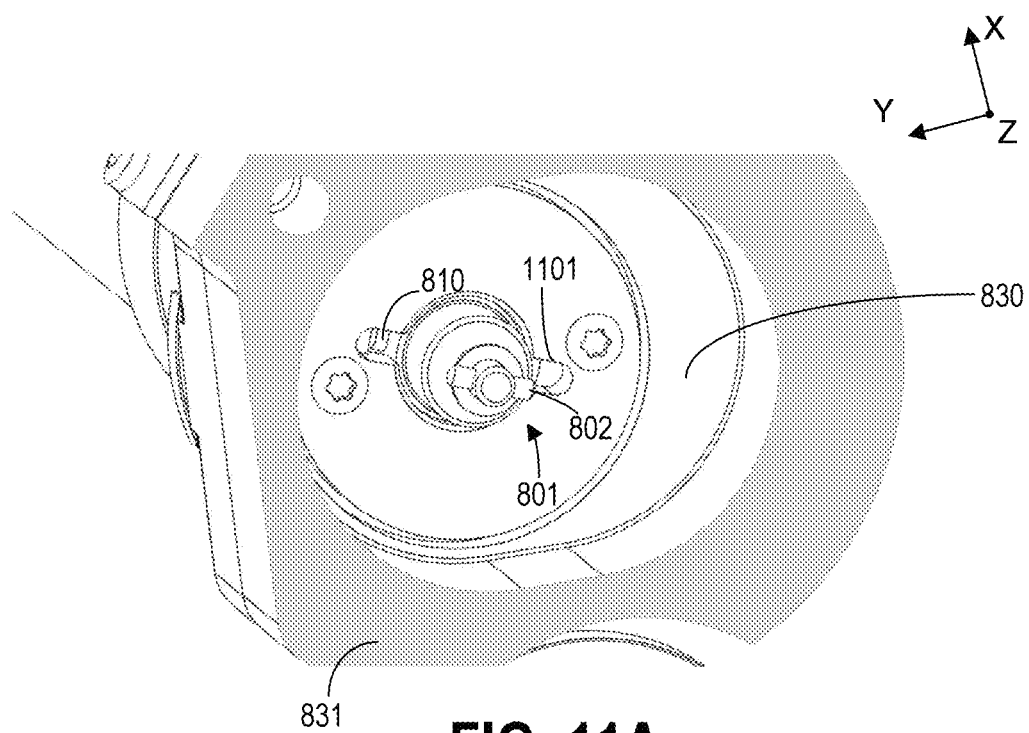
FIGS. 11A and 11B are two cross-sections of transfer shuttle.

FIG. 11A is the X-Y cross-section along line A-A' indicated in FIG. 6B. When the transfer rod is at the Unlock position, the shuttle carrier 801 is unlocked from wall 831 of the transfer shuttle. At this position, the second pin 810 can be moved out of groove 1101 on the wall 831 by pushing the shuttle carrier 801 along the Z-axis. In an opposite direction of Z-axis, groove 1101 first extends along the Z-axis, then twisted around the Z-axis. As such, when the transfer rod is operated to move from the Park position to the Lock position, the second pin first slides against the direction of Z-axis, then rotates around Z-axis to the locking position.

Figure 11B:
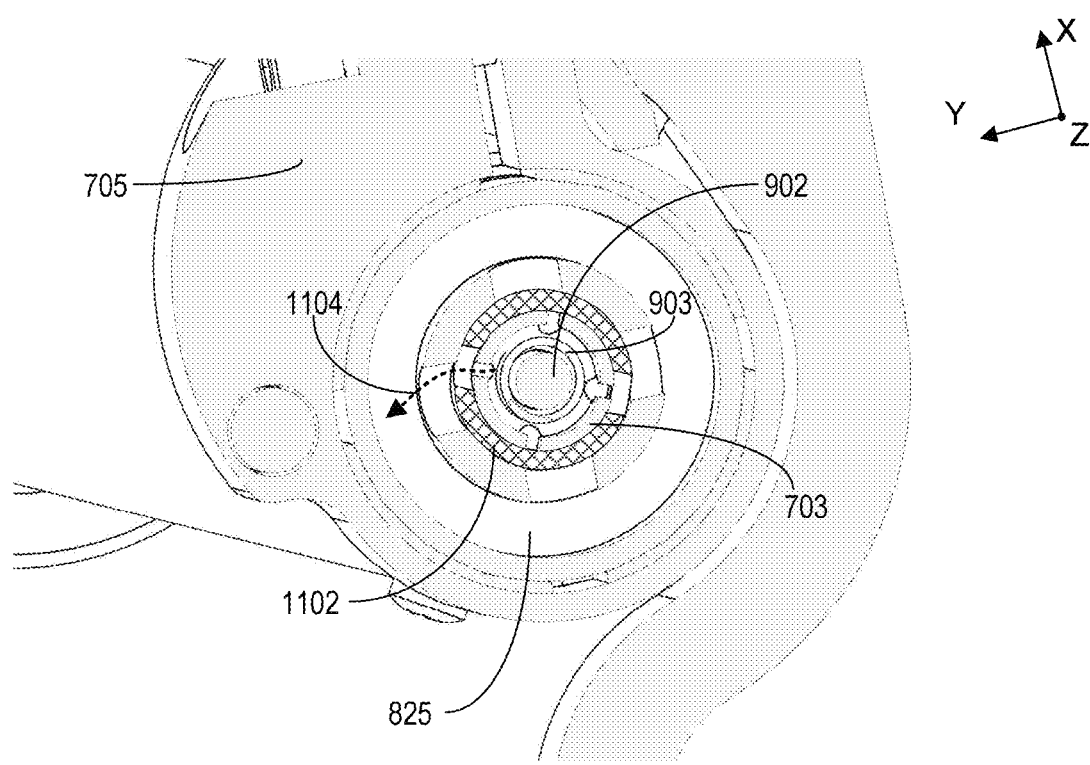

FIG. 11B is the X-Y cross-section along line B-B' indicated in FIG. 6B. The cap 703 and the transfer shuttle wall around receptacle (such as receptacle 904 of FIG. 9) create a channel to allow gas around the transfer post core 902 to be drawn into region 825, as shown by arrow 1104. The gas may then be removed from region 825 into the sample loader along a channel partially embedded in the transfer shuttle wall (such as channel 804 of FIG. 8B). In this way, gas or air at the distal end of the transfer rod (or around the distal end of the transfer post) can be removed before opening the shuttle valve.

Figure 12A:
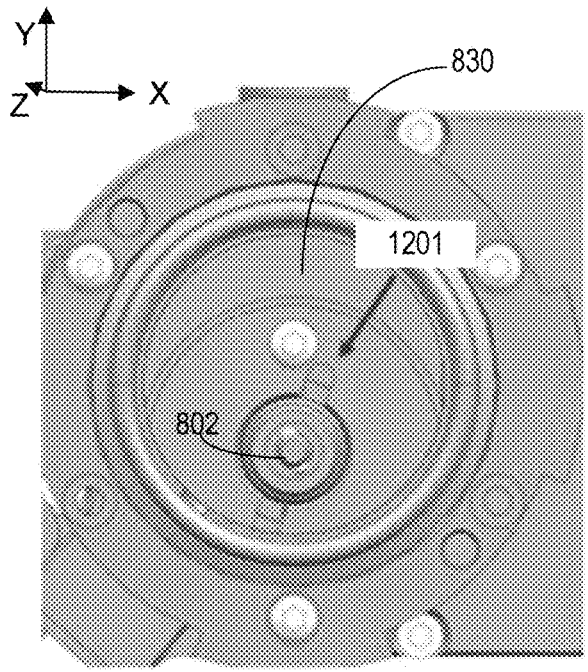
FIGS. 12A, 12B, 12C and 12D show different positions of the transfer rod.
Figure 12B:
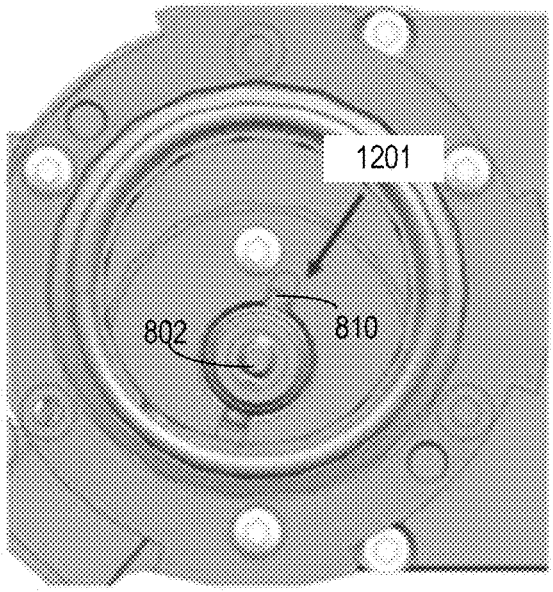
Figure 12C:
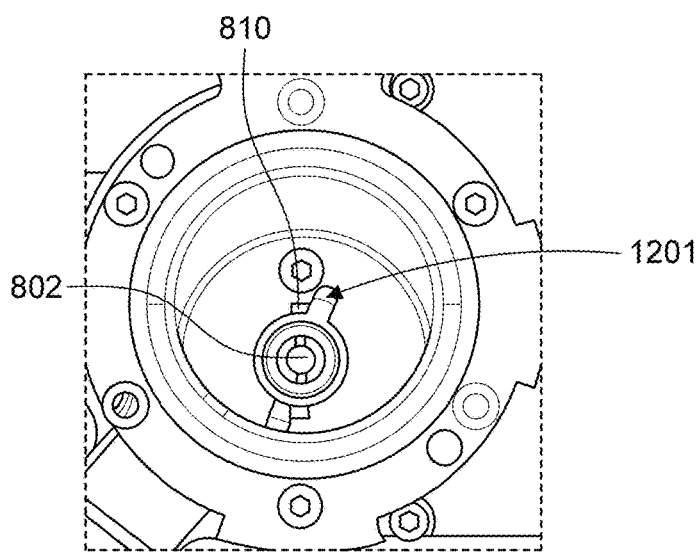
Figure 12D:
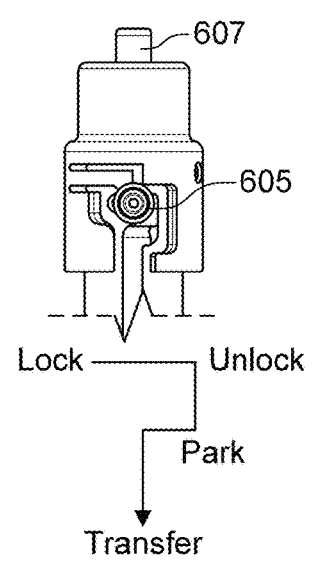

FIGS. 12A, 12B, and 12C show transfer rod in the Lock position, Unlock/Park position, and Transfer position, respectively. FIG. 12D illustrates the corresponding knob position at the proximal end of the transfer rod. At the Lock position in FIG. 12A, the second pin of the shuttle carrier within the groove (such as groove 1101 in FIG. 11A) is not aligned with groove opening 1201 to the shuttle chamber 830. At the Unlock/Park position in FIG. 12B, the second pin 810 of the shuttle carrier is aligned with the groove opening 1201 and can be moved out of the groove by pushing the transfer post along the Z-axis. At the Transfer position in FIG. 12C, the second pin is outside of the groove opening and aligned along the Y-axis. The shuttle carrier is ready to be transferred outside of the shuttle chamber 830.

Figure 13:
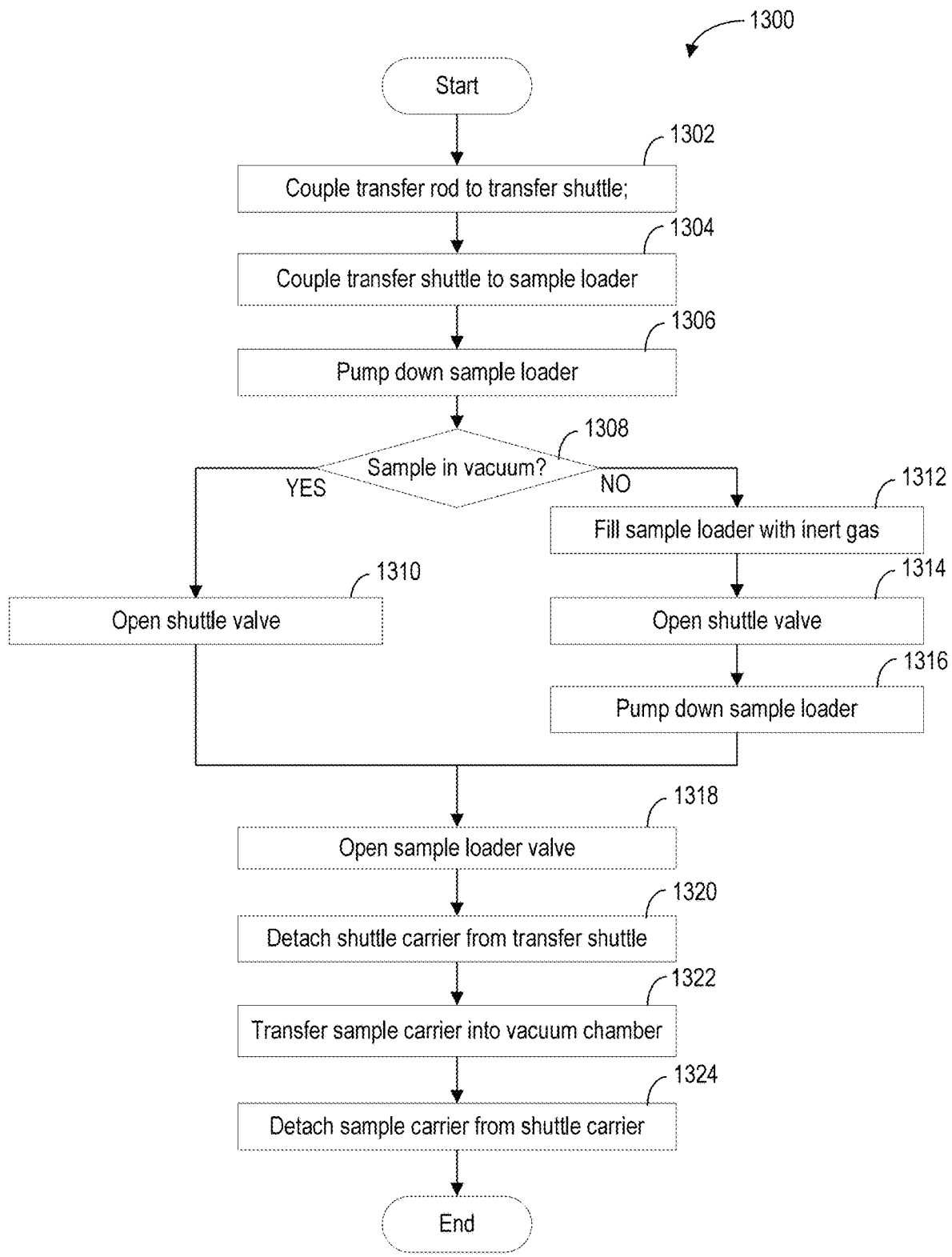
FIG. 13 shows a method for transferring sample into a charged particle microscope.

FIG. 13 shows an example method 1300 for transferring sample into a vacuum chamber, such as the vacuum chamber of a CPM, using the sample transfer system. The sample is positioned on a sample carrier attached to the transfer shuttle.

At 1302, the transfer rod is coupled to the transfer shuttle and the transfer rod is locked to the shuttle carrier. The transfer rod may be coupled to the transfer shuttle with rod clamp (such as rod clamp 322 in FIG. 3). The transfer rod may be locked to the shuttle carrier by operating the switch (such as switch 308 in FIG. 3) at the proximal end of the transfer post. Locking the transfer rod with the shuttle carrier includes locking the distal end of the transfer post with the shuttle carrier. The transfer rod is at the Lock position.

At 1304, the transfer shuttle is coupled to the sample loader. The transfer shuttle may be coupled to the sample loader fixed to the wall of the vacuum chamber using loader clamp (such as loader clamp 321 in FIG. 3). A fluid connection is formed between the sample loader and the distal end of the transfer rod. For example, the fluid connection may be formed by forming a channel (such as channel 804 in FIGS. 8A-8C) between the sample loader and the distal end of the transfer post. In some examples, the transfer rod may be coupled to the transfer shuttle after coupling the transfer shuttle to the sample loader.

At 1306, the sample loader is pumped down by providing vacuum in the chamber of the sample loader. For example, gas/air in the sample loader may be drawn from an opening (such as opening 1003 in FIG. 10) on the sample loader wall. Due to the fluidic connection between the sample loader and the distal end of the transfer rod, the distal end of the transfer rod is also pumped down. That is, gas/air at the distal end of the transfer rod (or the transfer post) is removed via the channel formed at 1304.

At 1308, method 1300 checks whether the sample is stored in vacuum environment in the shuttle chamber. If the shuttle chamber is under vacuum, method 1300 moves to 1310. Otherwise, if the shuttle chamber is not in vacuum (air or inert gas), method 1300 moves to 1312 to open the shuttle valve between the shuttle valve between the shuttle chamber and the sample loader.

At 1312, the sample loader is filled with inert gas. The inert gas may be flown into the sample loader via the same opening for drawing the gas at 1306.

At 1314, after the sample loader reached to a threshold gas pressure, the shuttle valve between the shuttle chamber and the sample loader is opened. Alternatively, the shuttle valve may be opened after flowing the insert gas for a predetermined duration.

At 1316, the sample loader is pumped down again to remove the inert gas in the shuttle chamber and sample loader.

At 1318, the sample loader valve between the sample loader and the vacuum chamber is opened after the sample loader reached to a threshold vacuum. Sample loader pressure may be monitored using a pressure sensor coupled to the transfer shuttle. In some examples, the sample loader valve may be opened after pumping down the sample loader for a predetermined duration.

At 1320, the shuttle carrier is detached from the transfer shuttle. The shuttle carrier may be detached from the transfer shuttle by moving the knob on the transfer rod sequentially from the Lock position to the Unlock position, Park position, and Transition position.

At 1322, the sample carrier locked to the shuttle carrier is transferred into the vacuum chamber by sliding the transfer post along the longitudinal axis of the transfer rod.

At 1324, the sample carrier is detached from the shuttle carrier. The sample carrier may then be coupled to a sample stage in the vacuum chamber for charged particle beam imaging or processing of the sample held on the sample carrier.

After transferring the sample carrier into the vacuum chamber, the sample transfer system may be kept attached to the vacuum chamber wall, or detached from the vacuum chamber wall.

Figure 14:
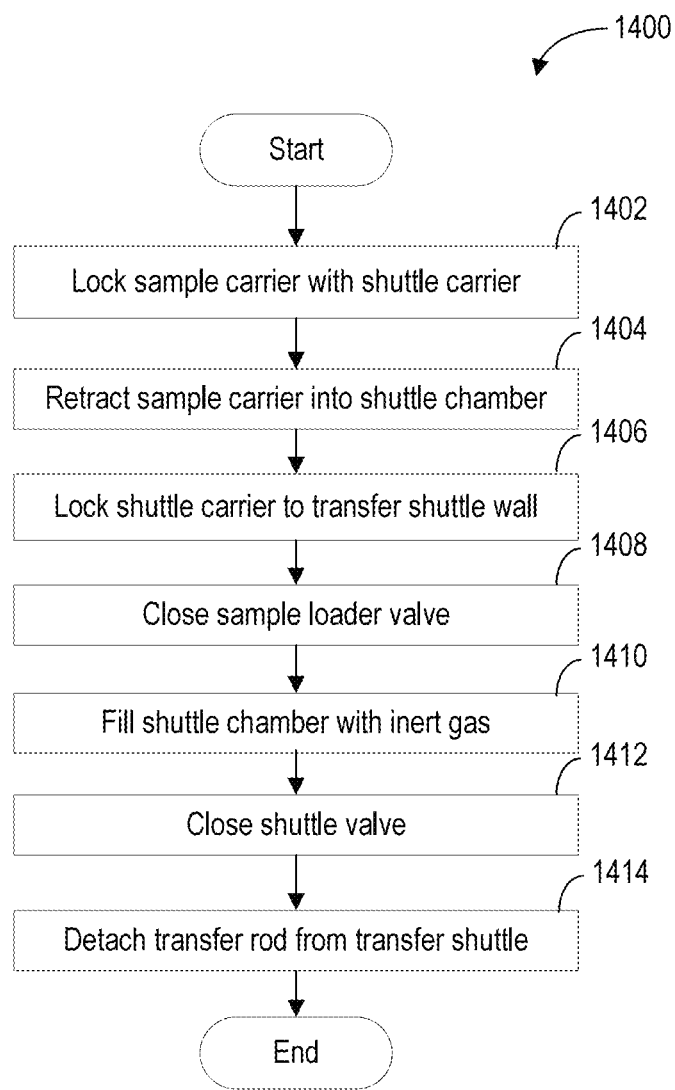
FIG. 14 shows a method for transferring sample from the charged particle microscope into the sample transfer system.

FIG. 14 shows example method 1400 for transferring the sample carrier from the vacuum chamber of the CPM to the transfer shuttle.

At 1402, the sample carrier is removed from the sample stage and locked to the shuttle carrier extended into the CPM vacuum chamber using the transfer rod.

At 1404, the shuttle carrier, together with the sample carrier, is retracted from the CPM vacuum chamber and moved into the shuttle chamber.

At 1406, the shuttle carrier is locked to the transfer shuttle wall by moving the transfer rod into the Lock position.

At 1408, the sample loader valved is closed to hermetically seal the sample loader from the CPM vacuum chamber.

At 1410, the shuttle chamber is optionally filled with inert gas, such as Argon gas. For example, the gas may flow into the shuttle chamber via the opening on the sample loader's wall. The gas pressure in the shuttle chamber may be monitored with a pressure sensor coupled to the transfer shuttle. (If the sample need to be transferred under Ar)

At 1412, the shuttle valve is closed. As such, the shuttle chamber is hermetically sealed from the external environment.

At 1414, the transfer rod may be detached from the transfer shuttle by operating both the switch at the proximal end of the transfer post and releasing the rod clamp. (or detach the transfer rod and shuttle together from loader)

Figure 15:
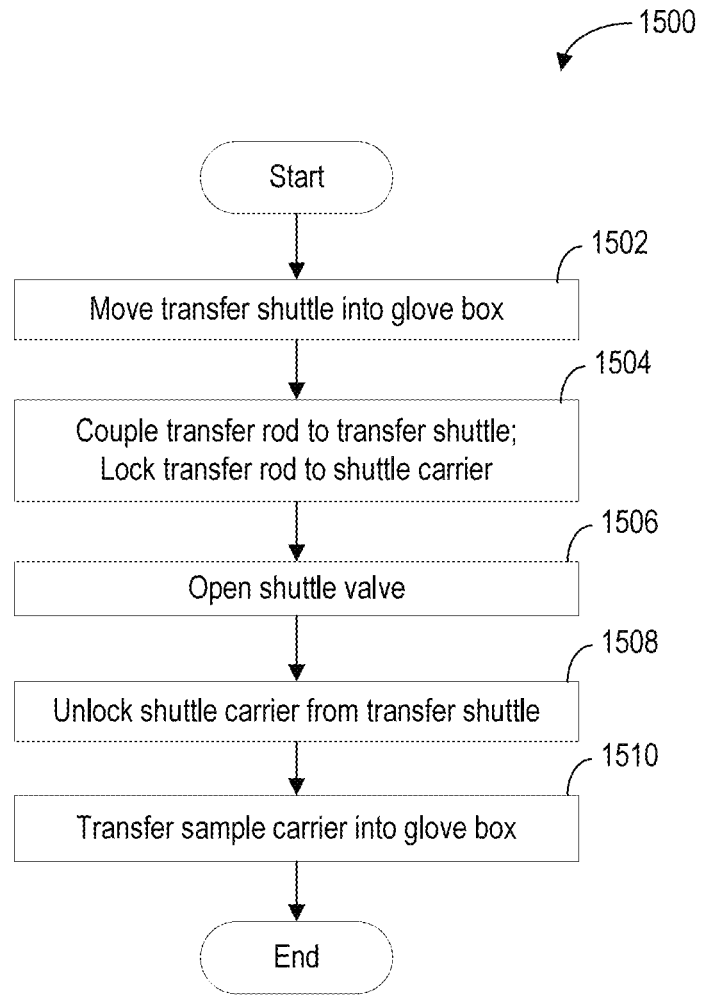
FIG. 15 shows a method for transferring sample from the sample transfer system into a glove box.

FIG. 15 is an example method 1500 for transferring sample into a glove box using the sample transfer system. The transfer rod may be kept inside the glove box for moving sample inside/outside of the transfer shuttle. The transfer rod used inside the glove box may be shorter than the one used for sample transfer with CPM in FIGS. 14 and 15.

At 1502, the transfer shuttle holding the sample is moved into the glove box via the antechamber.

At 1504, a transfer rod inside the glove box is coupled to the transfer shuttle. Further, the distal end of the transfer post is locked to the shuttle carrier.

At 1506, the shuttle valve is opened so that the shuttle chamber is fluidically connected with the glove box.

At 1508, the shuttle carrier is unlocked from the transfer shuttle by moving the transfer rod from the Lock position to the Transfer position.

At 1510, the sample carrier, which is locked to the shuttle carrier, may be moved out of the shuttle chamber. The operator may then manually remove the sample carrier from the sample transfer system.

The sample carrier may be transferred outside of the glove box using the sample transfer system by reversing the step sequence of method 1500.

In this way, the transfer shuttle may be detached from the transfer rod while moving sample into and out of the glove box. A separate, short, transfer rod may be used to open or close the transfer shuttle within the glove box. The short transfer rod can easily be moved into the glove box with existing antechamber.

The technical effect of a sample transfer system with a detachable transfer rod is that the overall profile of the sample transfer system is reduced, so that the sample may be moved into and out of the glove box with a relatively small antechamber using only the transfer shuttle. The technical effect of fluidically connect the distal end of the transfer rod with the sample loader is that gas/air adjacent to the distal end of the transfer post may be removed before opening the shuttle valve. The technical effect of including a pressure sensor for measuring the shuttle chamber pressure is that the sample storage environment within the shuttle chamber may be monitored.

Clause 1. A sample transfer system for transferring a sample carrier into or out of a vacuum chamber, comprising: a transfer shuttle including a shuttle chamber for receiving the sample carrier; and a transfer rod detachably coupled to the transfer shuttle, wherein the sample carrier is transferrable into or out of the shuttle chamber by operating the transfer rod.

Clause 2. The sample transfer system of clause 1, wherein the transfer rod is hermitically sealable from the shuttle chamber.

Clause 3. The sample transfer system of clauses 1-2, wherein the transfer shuttle is detachably coupled to a sample loader fixed to a wall of the vacuum chamber, and a distal end of the transfer rod is fluidically connectable with the sample loader while hermitically sealed from the shuttle chamber.

Clause 4. The sample transfer system of clause 3, wherein the distal end of the transfer rod is fluidically connectable with the sample loader via a channel, at least a part of the channel is embedded in a wall of the transfer shuttle.

Clause 5. The sample transfer system of clauses 1-4, wherein the transfer rod includes a transfer post and a shell extending along a longitudinal axis of the transfer rod, and operating the transfer rod includes sliding the transfer post relative to the shell.

Clause 6. The sample transfer system of clause 5, wherein the transfer post includes a distal end detachable coupled with a shuttle carrier of the transfer shuttle, the sample carrier is detachably coupled to the shuttle carrier.

Clause 7. The sample transfer system of clause 6, wherein the transfer post further includes a switch for locking the transfer post to the shuttle carrier.

Clause 8. The sample transfer system of clause 6, wherein the transfer post further includes a knob for adjusting a position of the shuttle carrier.

Clause 9. The sample transfer system of clause 8, wherein the transfer post is sliding movable along the shell by pushing the knob along the shell.

Clause 10. The sample transfer system of clause 9, wherein the knob slides along a slit on the shell, wherein the slit extends along a longitudinal axis of the transfer rod.

Clause 11. The sample transfer system of clauses 1-10, wherein the shell is in cylindrical shape.

Clause 12. The sample transfer system of clauses 1-11, wherein the vacuum chamber is a sample chamber of a charged particle instrument.

Clause 13. The sample transfer system of clauses 1-12, wherein the sample transfer system further includes a pressure sensor for monitoring a pressure in the shuttle chamber.

Clause 14. The sample transfer system of clauses 1-13, wherein one or more samples are positioned on the sample carrier, and at least one sample of the one or more samples is irradiated with a charged particle beam within the vacuum chamber when the one or more samples are held by the sample carrier.

Clause 15. The sample transfer system of clause 1-14, wherein the transfer shuttle further includes a shuttle valve for sealing the shuttle chamber from the sample loader.

Clause 16. A method for transferring a sample into a vacuum chamber, comprising:
   attaching a first side of a transfer shuttle to a sample loader fixed to a wall of the vacuum chamber, wherein a transfer rod is detachably coupled to a second side of the transfer shuttle;
   providing vacuum to the sample loader;
   fluidically connecting a shuttle chamber of the transfer shuttle with the vacuum chamber; and
   transferring a sample carrier from the shuttle chamber into the vacuum chamber by operating the transfer rod.

Clause 17. The method of clause 16, further comprising: before providing vacuum to the sample loader, fluidically connecting a distal end of the transfer rod with the sample loader while keeping the shuttle chamber hermitically sealed from the transfer rod and the sample loader.

Clause 18. The method of clauses 16-17, wherein the transfer shuttle is hermitically sealed from the sample loader with a shuttle valve, and fluidically connecting the shuttle chamber with the sample loader includes opening the shuttle valve.

Clause 19. The method of clauses 16-18, wherein the distal end of the transfer rod is fluidically connected with the sample loader via a channel, the channel is partially within a wall of the transfer shuttle.

Clause 20. The method of clauses 16-19, wherein the transfer rod includes a transfer post enclosed by a shell, the transfer post sliding movable within the shell, and gas at a distal end of the transfer post is drawn by the vacuum in the sample loader when the distal end of the transfer rod is fluidically connected with the sample loader.

Clause 21. The method of clauses 16-20, wherein detachably coupling the transfer rod to the second side of the transfer shuttle includes locking a transfer post of the transfer rod with a shuttle carrier of the transfer shuttle.

Clause 22. The method of clauses 16-21, further comprising:
   before attaching the first side of the transfer shuttle to the sample loader, loading sample carrier into the shuttle chamber in a glove box with a second transfer rod attached to the second side of the transfer shuttle;
   hermitically sealing the shuttle chamber;
   detaching the second transfer rod from the transfer shuttle; and
   moving the transfer shuttle out of the glove box.

Clause 23. The method of clauses 16-22, wherein transferring a sample carrier from the shuttle chamber into the vacuum chamber includes transferring the sample carrier from the shuttle chamber to a sample stage within the vacuum chamber.

Clause 24. The method of clauses 16-23, wherein the transfer rod includes a transfer post enclosed within a shell, the transfer post sliding movable within the shell, and transferring the sample carrier from the shuttle chamber to the vacuum chamber includes sliding the transfer post relative to the shell towards the vacuum chamber.

Clause 25. The method of clauses 16-24, wherein the first side is opposite from the second side.

Clause 26. The method of clauses 16-25, further comprising: after providing vacuum to the sample loader and before fluidically connecting the shuttle chamber with the vacuum chamber, filing the sample loader with inert gas; fluidically connecting the shuttle chamber with the sample loader; and providing vacuum in the sample loader.

Clause 27. A method for transferring a sample out of a vacuum chamber, comprising:
  mechanically coupling a sample carrier holding the sample to a shuttle carrier of a transfer shuttle, wherein the shuttle carrier is locked to a transfer rod detachably connected with the transfer shuttle;
  transferring the sample carrier from the vacuum chamber into a shuttle chamber of the transfer shuttle by operating the transfer rod;
  hermetically sealing the shuttle chamber from the vacuum chamber; and
  detaching the transfer shuttle from the vacuum chamber.

Clause 28. The method of clause 27, wherein hermetically sealing the shuttle chamber from the transfer rod includes closing a shuttle valve of the transfer shuttle.

Clause 29. The method of clauses 27-28, further comprising detaching the transfer rod from the transfer shuttle after hermetically sealing the shuttle chamber from the vacuum chamber.

Clause 30. The method of clauses 27-29, further comprising filling the shuttle chamber with inert gas before hermetically sealing the shuttle chamber from the vacuum chamber.

Clause 31. The method of clauses 27-30, wherein the vacuum chamber is a sample chamber of a charged particle instrument.

What is claimed is:

1. A sample transfer system for transferring a sample carrier into or out of a vacuum chamber, comprising:
  a transfer shuttle including a shuttle chamber for receiving the sample carrier; and
  a transfer rod detachably coupled to the transfer shuttle, wherein the sample carrier is transferrable into or out of the shuttle chamber by operating the transfer rod, wherein the transfer rod includes a transfer post and a shell extending along a longitudinal axis of the transfer rod, and operating the transfer rod includes sliding the transfer post relative to the shell.

2. The sample transfer system of claim 1, wherein the transfer rod is hermetically sealable from the shuttle chamber.

3. The sample transfer system of claim 2, wherein the transfer shuttle is detachably coupled to a sample loader fixed to a wall of the vacuum chamber, and a distal end of the transfer rod is fluidically connectable with the sample loader while hermetically sealed from the shuttle chamber.

4. The sample transfer system of claim 3, wherein the distal end of the transfer rod is fluidically connectable with the sample loader via a channel, at least a part of the channel is embedded in a wall of the transfer shuttle.

5. The sample transfer system of claim 1, wherein the transfer post includes a distal end detachable coupled with a shuttle carrier of the transfer shuttle, the sample carrier is detachably coupled to the shuttle carrier.

6. The sample transfer system of claim 1, wherein the vacuum chamber is a sample chamber of a charged particle instrument.

7. The sample transfer system of claim 1, wherein the sample transfer system further includes a pressure sensor for monitoring a pressure in the shuttle chamber.

8. The sample transfer system of claim 1, wherein one or more samples are positioned on the sample carrier, and at least one sample of the one or more samples is irradiated with a charged particle beam within the vacuum chamber when the one or more samples are held by the sample carrier.

9. A method for transferring a sample into a vacuum chamber, comprising:
  attaching a first side of a transfer shuttle to a sample loader fixed to a wall of the vacuum chamber, wherein a transfer rod is detachably coupled to a second side of the transfer shuttle;
  fluidically connecting a distal end of the transfer rod with the sample loader while keeping the shuttle chamber hermitically sealed from the rod and the sample loader;
  providing vacuum to the sample loader;
  fluidically connecting a shuttle chamber of the transfer shuttle with the vacuum chamber; and
  transferring a sample carrier from the shuttle chamber into the vacuum chamber by operating the transfer rod.

10. The method of claim 9, wherein the transfer shuttle is hermitically sealed from the sample loader with a shuttle valve, and fluidically connecting the shuttle chamber with the sample loader includes opening the shuttle valve.

11. The method of claim 9, wherein the distal end of the transfer rod is fluidically connected with the sample loader via a channel, the channel is partially within a wall of the transfer shuttle.

12. The method of claim 9, wherein the transfer rod includes a transfer post enclosed by a shell, the transfer post sliding movable within the shell, and gas at a distal end of the transfer post is drawn by the vacuum in the sample loader when the distal end of the transfer rod is fluidically connected with the sample loader.

13. The method of claim 9, wherein detachably coupling the transfer rod to the second side of the transfer shuttle includes locking a transfer post of the transfer rod with a shuttle carrier of the transfer shuttle.

14. The method of claim 9, further comprising:
  before attaching the first side of the transfer shuttle to the sample loader, loading sample carrier into the shuttle chamber in a glove box with a second transfer rod attached to the second side of the transfer shuttle;
  hermitically sealing the shuttle chamber;
  detaching the second transfer rod from the transfer shuttle; and
  moving the transfer shuttle out of the glove box.

15. The method of claim 9, further comprising: after providing vacuum to the sample loader and before fluidically connecting the shuttle chamber with the vacuum chamber, filing the sample loader with inert gas; fluidically connecting the shuttle chamber with the sample loader; and providing vacuum in the sample loader.

16. A method for transferring a sample out of a vacuum chamber, comprising:
  mechanically coupling a sample carrier holding the sample to a shuttle carrier of a transfer shuttle, wherein the shuttle carrier is locked to a transfer rod detachably connected with the transfer shuttle, wherein the transfer rod includes a transfer post and a shell extending a long a longitudinal axis of the transfer rod, and operating the transfer rod includes sliding the transfer post relative to the shell;

transferring the sample carrier from the vacuum chamber into a shuttle chamber of the transfer shuttle by operating the transfer rod;

hermetically sealing the shuttle chamber from the vacuum chamber; and detaching the transfer shuttle from the vacuum chamber.

17. The method of claim 16, further comprising detaching the transfer rod from the transfer shuttle after hermetically sealing the shuttle chamber from the vacuum chamber.

18. The method of claim 16, further comprising filling the shuttle chamber with inert gas before hermetically sealing the shuttle chamber from the vacuum chamber.

* * * * *